(12) United States Patent
Beaman et al.

(10) Patent No.: US 6,332,270 B2
(45) Date of Patent: *Dec. 25, 2001

(54) METHOD OF MAKING HIGH DENSITY INTEGRAL TEST PROBE

(75) Inventors: Brian Samuel Beaman, Hyde Park; Keith Edward Fogel, Mohegan Lake; Paul Alfred Lauro, Nanuet; Maurice H. Norcott, Fishkill; Da-Yuan Shih, Poughkeepsie; George Frederick Walker, New York, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,179

(22) Filed: Nov. 23, 1998

(51) Int. Cl.[7] ................................................. H01R 9/14
(52) U.S. Cl. ............................ 29/844; 324/754; 324/762; 439/66

(58) Field of Search ............................... 29/874, 882, 884, 29/825, 844; 324/762, 754; 439/66

(56) References Cited

U.S. PATENT DOCUMENTS

| | | | |
|---|---|---|---|
| 5,785,538 | * | 7/1998 | Beaman et al. . |
| 5,811,982 | * | 9/1998 | Beaman et al. . |
| 5,914,614 | * | 6/1999 | Beaman et al. . |
| 5,952,840 | * | 9/1999 | Farnworth et al. . |
| 6,062,879 | * | 5/2000 | Beaman et al. . |

* cited by examiner

*Primary Examiner*—Carl J. Arbes
(74) *Attorney, Agent, or Firm*—Daniel P. Morris

(57) ABSTRACT

A high density integrated test probe and method of fabrication is described. A group of wires are ball bonded to contact locations on the surface of a fan out substrate. The wires are sheared off leaving a stub, the end of which is flattened by an anvil. Before flattening a sheet of material having a group of holes is arranged for alignment with the group of stubs is disposed over the stubs. The sheet of material supports the enlarged tip. The substrate with stubs form a probe which is moved into engagement with contact locations on a work piece such as a drip or packaging substrate.

12 Claims, 7 Drawing Sheets

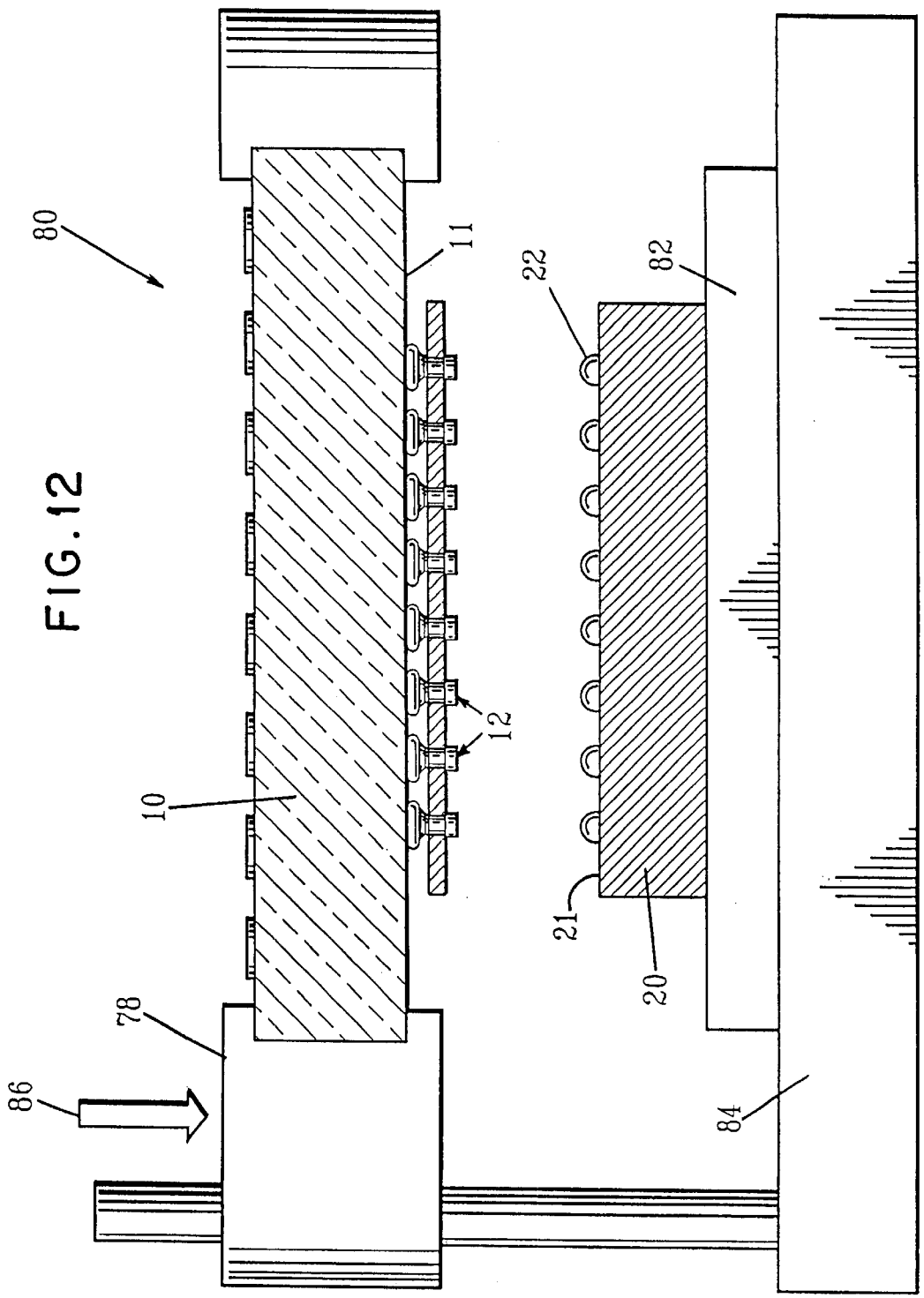

METHOD OF MAKING HIGH DENSITY INTEGRAL TEST PROBE

FIELD OF THE INVENTION

The present invention is directed to probe structures for testing of electrical interconnections to integrated circuit devices and other electronic components and particularly to testing integrated circuit devices with high density areas array solder ball interconnections at high temperatures.

BACKGROUND OF THE INVENTION

Integrated circuit (IC) devices and other electronic components are normally tested to verify the electrical function of the device and certain devices require high temperature burn-in testing to accelerate early life failures of these devices. Wafer probing is typically done at temperatures ranging from 25 C.–125 C. while typical burn-in temperatures range from 80 C. to 140 C. Wafer probing and IC chip burn-in at elevated temperatures of up to 200 C. has several advantages and is becoming increasingly important in the semiconductor industry.

The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe sockets that is hard wired to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe cannot be used for testing integrated circuit devices that have high density area array contacts. Use of this type of probe for high temperature testing is limited by the probe structure and material set.

High temperature wafer probing and burn-in testing has a number of technical challenges. Gold plated contacts are commonly used for testing and burn-in of IC devices. At high temperatures, the gold plated probes will interact with the solder balls on the IC device to form an intermetallic layer that has high electrical resistance and brittle mechanical properties. The extent of the intermetallic formation is dependent on the temperature and duration of the contact between the gold plated probe and the solder balls on the IC device. The gold-tin intermetallic contamination of the solder balls has a further effect of reducing the reliability of the flip chip interconnection to the IC device. Another problem caused by the high temperature test environment is diffusion of the base metal of the probe into the gold plating on the surface. The diffusion process is accelerated at high temperatures and causes a high resistive oxide layer to form on the surface of the probe contact.

OBJECT OF THE INVENTION

It is the object of the present invention to provide a probe for testing integrated circuit devices and other electronic components that use solder balls for the interconnection means.

Another object of the present invention is to provide a probe that is an integral part of the fan out wiring on the test substrate or other printed wiring means to minimize the contact resistance of the probe interface.

A further object of the present invention is to provide an enlarged probe tip to facilitate alignment of the probe array to the contact array on the IC device for wafer probing.

An additional object of the present invention is to provide a suitable contact metallurgy on the probe surface to inhibit oxidation, intermetallic formation, and out-diffusion of the contact interface at high temperatures.

Yet another object of the present invention is to provide a suitable polymer material for supporting the probe contacts that has a coefficient of thermal expansion that is matched to the substrate material and has a glass transition temperature greater than 200 C.

Yet a further object of the present invention is to provide a probe with a cup shaped geometry to contain the high temperature creep of the solder ball interconnection means on the integrated circuit devices during burn-in testing.

Yet an additional object of the present invention is to provide a probe with a cup shaped geometry to facilitate in aligning the solder balls on the integrated circuit device to the probe contact.

SUMMARY OF THE INVENTION

A broad aspect of the claimed invention is an apparatus for electrically testing a work piece having a plurality of electrically conductive contact locations thereon having: a substrate having a first surface and a second surface; a plurality of first electrical contact locations on the first side; a plurality of probe tips disposed on the first contact locations; each of the probe tips having an elongated electrically conductive member projecting from an enlarged base, the base being disposed on said contact locations; and, means for moving said substrate towards the work piece so that the plurality of probe tips are pressed into contact with the plurality of contact locations on said work piece.

Another broad aspect of the present invention is a method including the steps of: providing a substrate having a surface; bonding an elongated electrical conductor to the surface by forming a ball bond at the surface; shearing said elongated conductor from said ball bond leaving an exposed end of said elongated conductor, and flattening the exposed end.

BRIEF DESCRIPTION OF THE DRAWINGS

These and other objects, features, and advantages of the present invention will become apparent upon further consideration of the following detailed description of the invention when read in conjunction with the drawing figures, in which:

FIG. 12 schematically shows the structure of FIG. 1 in combination with a means for moving the probe into engagement.

DETAILED DESCRIPTION OF THE INVENTION

Figure 1:
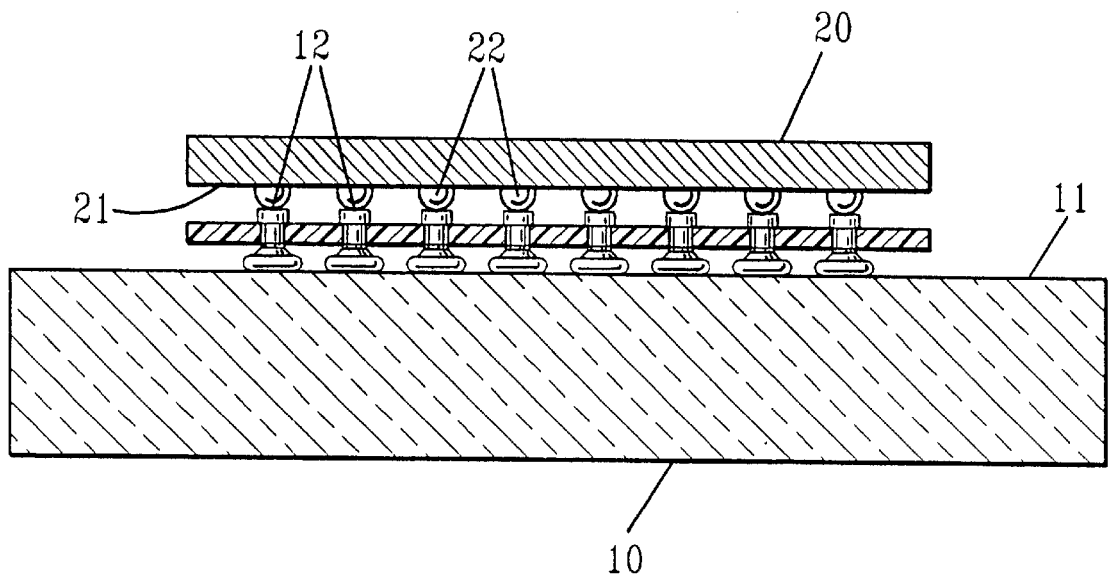
FIG. 1 shows a cross section of a high density integral rigid test probe attached to a substrate and pressed against the solder balls on an integrated circuit device.

FIG. 1 shows a cross section of a test structure (10) and high density integral rigid test probe (12) according to the present invention. The test substrate (10) provides a rigid base for attachment of the probe structures (12) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring, or epoxy glass laminate construction with high density copper wiring. The integral rigid test process (12) are attached to the first surface (11) of the substrate (10). The probes are used to contact the solder balls (22) on the integrated circuit device (20). The solder balls (22) are attached to the first surface (21) of the integrated circuit device (20).

Figure 2:
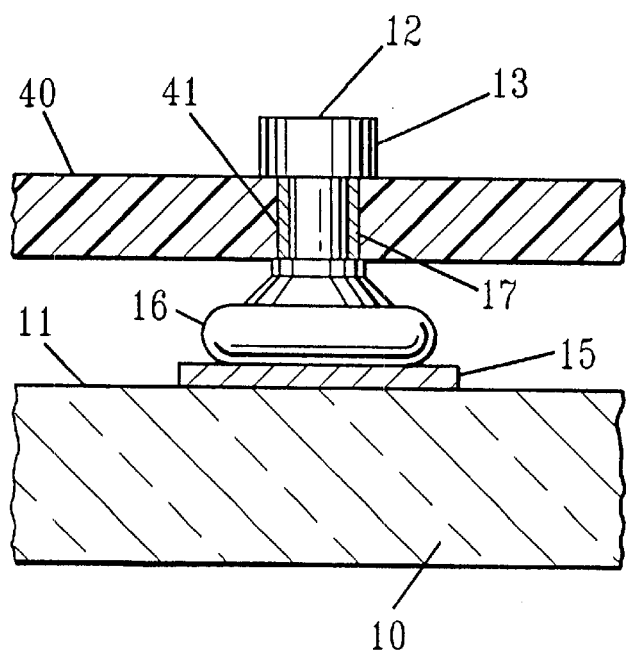
FIG. 2 shows an enlarged cross section of a single high density integral rigid test probe attached to the fan out wiring on the test substrate.

FIG. 2 shows an enlarged cross section of the high density integral rigid test probe (12). The probe tip is enlarged (13) to provide better alignment tolerance of the probe array to the array of solder balls (22) on the IC device (20). The integral rigid test probe (12) is attached directly to the fan out wiring (15) on the first surface (11) of the substrate (10) to minimize the resistance of the probe interface. The probe geometry includes the ball bond (16), the wire stud (17), and the enlarged probe tip (13). A sheet of polymer material (40) with holes (41) corresponding to the probe positions is used to support the enlarged tip (13) of the probe geometry. It is desirable to match the coefficient of thermal expansion for the polymer sheet (40) material and the substrate material to minimize stress on the interface between the ball bond (16) and the fan out wiring (15). As an example, the BPDA-PDA polyimide can be used with a silicon wafer substrate since both have a coefficient of thermal expansion (TCE) of 3 ppm/C. This material is also stable up to 350 C.

Figure 3:
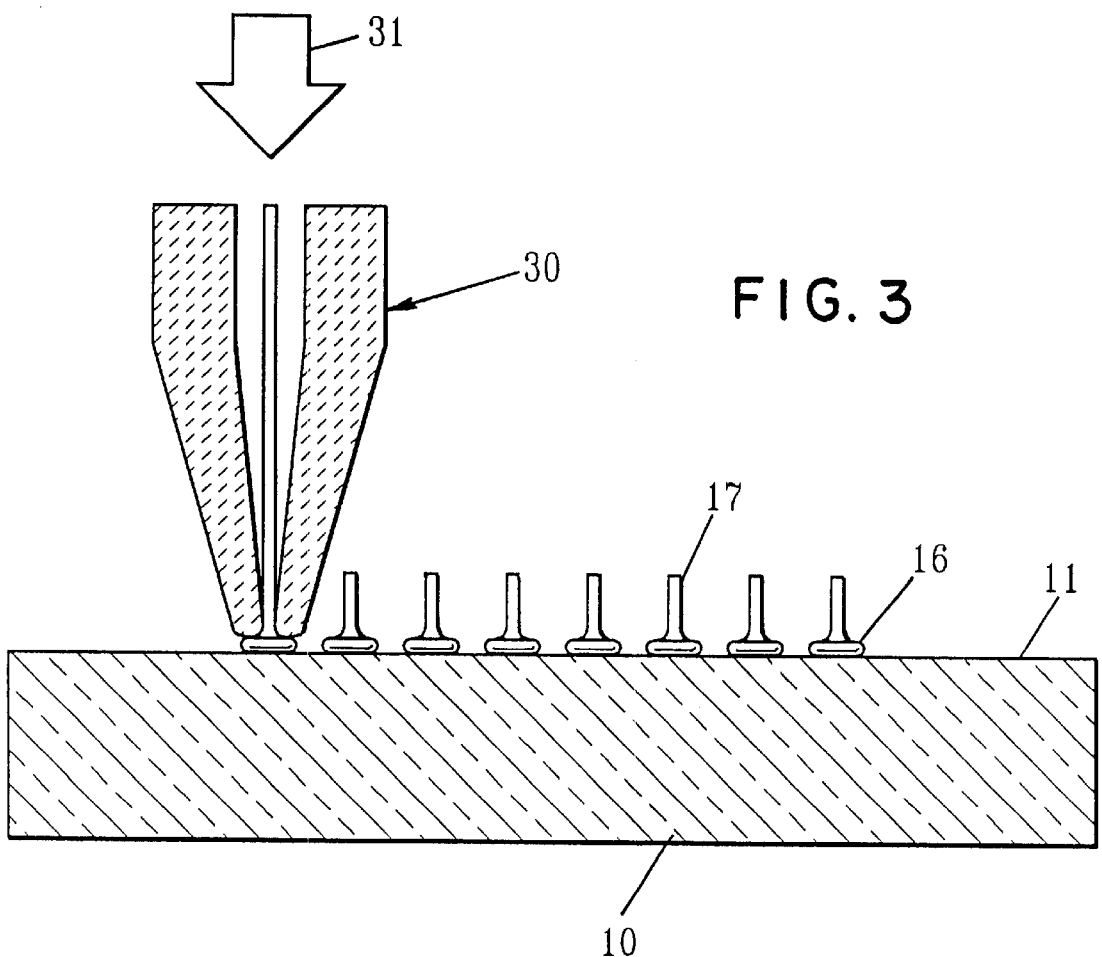
FIGS. 3–7 show the processes used to fabricate the high density integral rigid test probe structure on a fan out wiring substrate.

FIG. 3 shows the first process used to fabricate the integral rigid test probe. A thermosonic wire bonder tool is used to attach ball bonds (16) to the first surface (11) of the rigid substrate (10). The wire bonder tool uses a first ceramic capillary (30) to press the ball shaped end of the bond wire against the first surface (11) of the substrate (10). Compression force and ultrasonic energy (31) are applied through the first capillary (30) tip and thermal energy is applied from the wire bonder stage through the substrate (10) to bond the ball shaped end of the bond wire to the first surface (11) of the substrate. The bond wire is cut, sheared, or broken to leave a small stud (17) protruding vertically from the ball bond (16).

Figure 4:
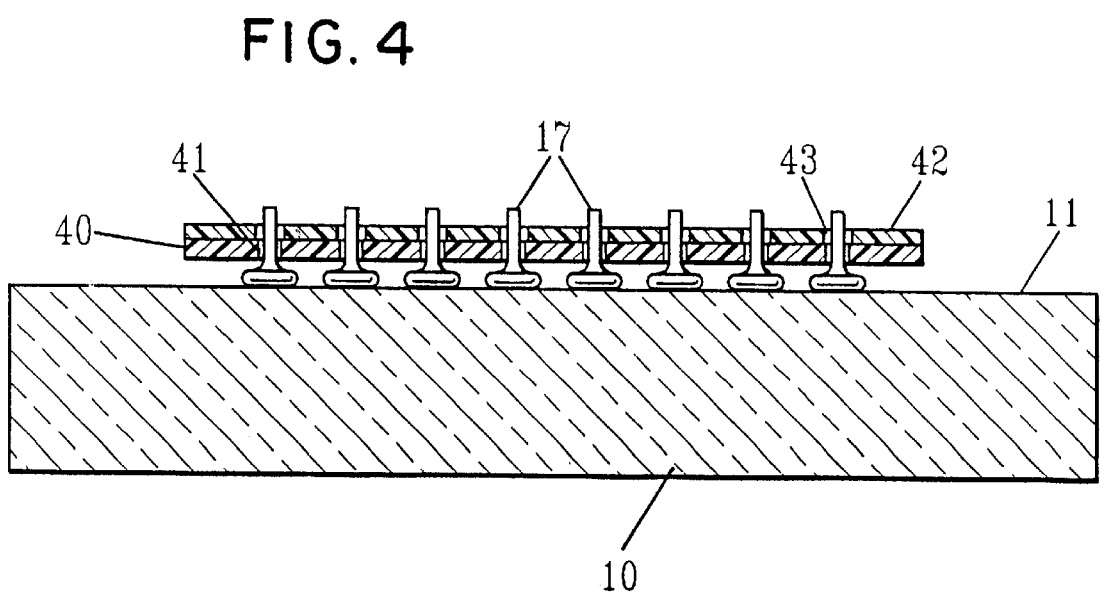

A first sheet of polymer material (40) with holes (41) corresponding to the probe locations on the substrate is placed over the array of wire studs (17) as shown in FIG. 4. The diameter of the holes (41) in the polymer sheet (40) is slightly larger than the diameter of the wire studs (17). A second sheet of metal or a hard polymer (42) with holes (43) corresponding to the probe locations is also placed over the array of wire studs (17). The diameter of the holes (43) in the metal sheet (42) is larger than the diameter of the holes (41) in the polymer sheet (40).

Figure 5:
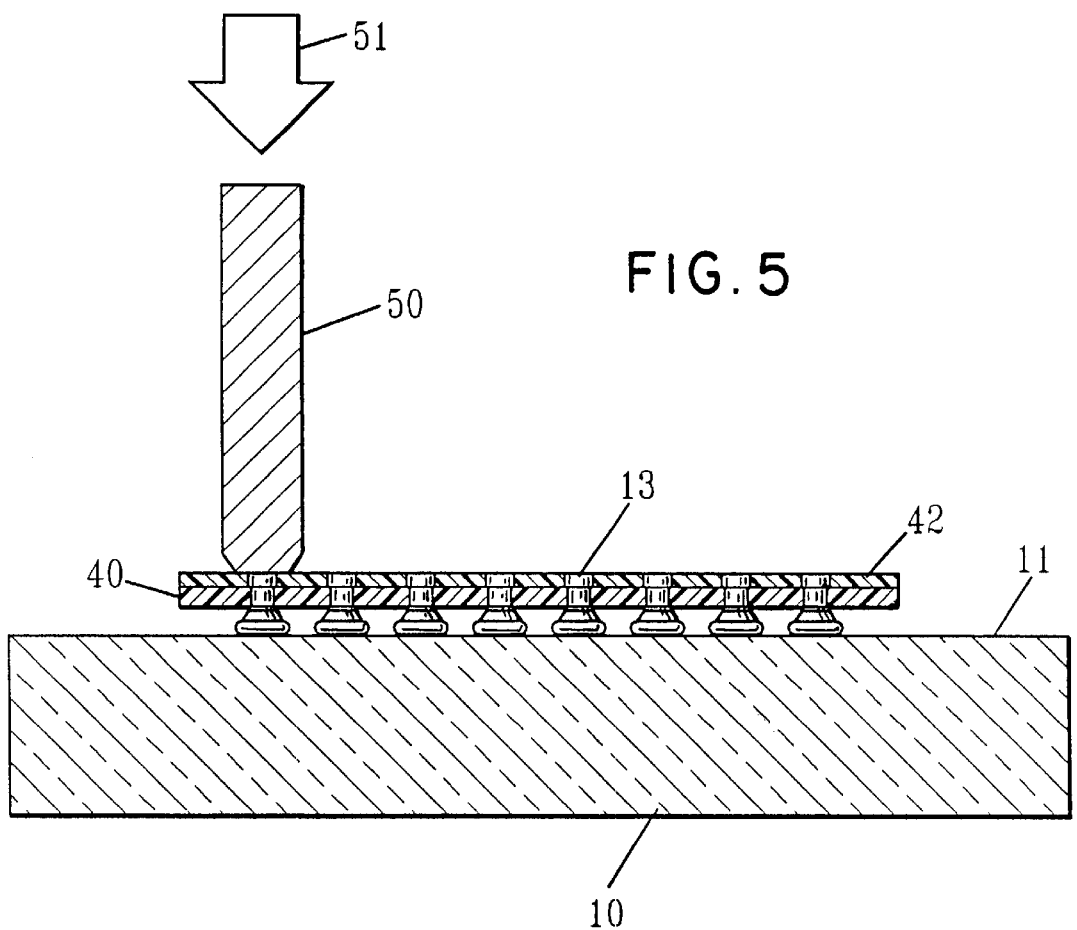
Figure 6:
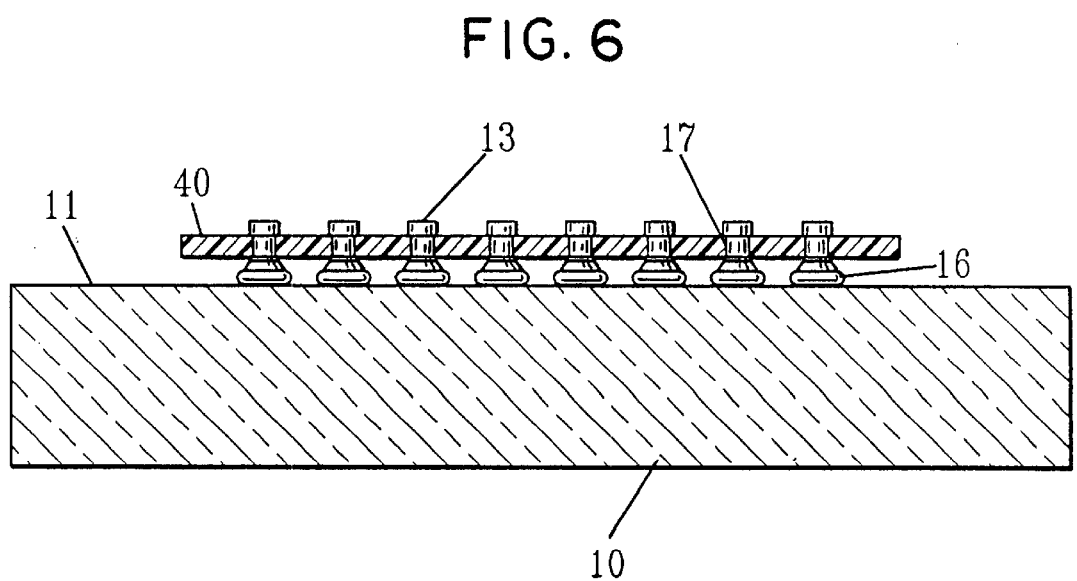

The enlarged ends of the probe tips are formed using a hardened anvil tool (50) as shown in FIG. 5. Compression force and ultrasonic energy (51) are applied through the anvil tool (50) to deform the ends of the wire studs (17). The size of the enlarged probe tip (13) is controlled by the length of the wire stud (17) protruding through the polymer sheet (40), the thickness of the metal sheet (42), and the diameter of the holes (43) in the metal sheet (42). The enlarged ends of the probes (13) can be formed individually or in multiples depending on the size of the anvil tool (50) that is used. Also, the surface finish of the anvil tool (50) can be modified to produce a smooth or textured finish on the enlarged probe tips (13). FIG. 6 shows the high density integral rigid test probe with the metal mask (42) removed from the assembly.

Figure 7:
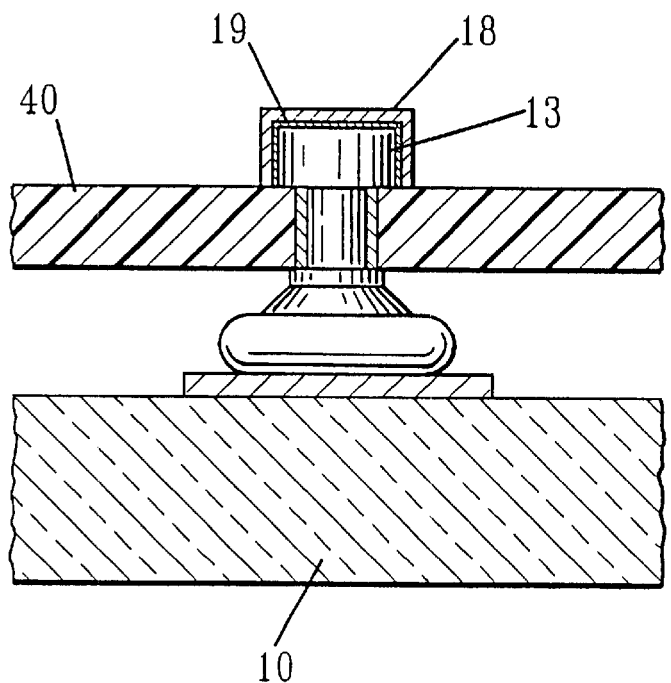

FIG. 7 shows the sputtering or evaporation process used to deposit the desired contact metallurgy (18) on the enlarged end (13) of the probe tip. Contact metallurgies (18) such as Pt, Ir, Rh, Ru, and Pd can be deposited in the thickness range of 1000 to 5000 angstroms over the probe tip (13) to ensure low contact resistance with thermal stability and oxidation resistance when operated a elevated temperatures in air. A thin layer of TiN, Cr, Ti, Ni, or Co can be used as a diffusion barrier (19) between the enlarged probe tip (13) and the contact metallurgy (18) on the surface of the probe.

Figure 8:
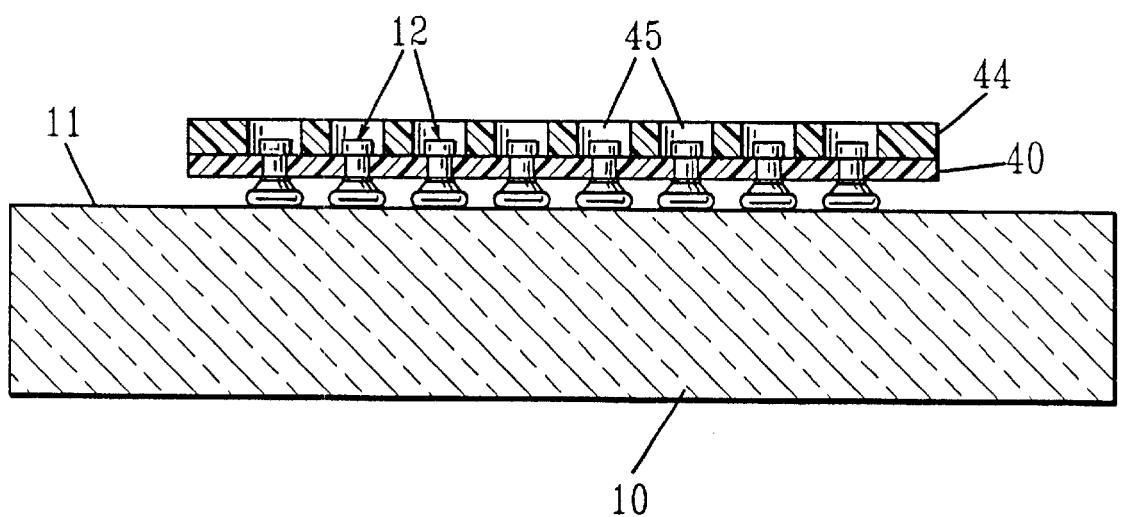
FIG. 8 shows an alternate embodiment of the high density integral rigid test probe structure with a cup shaped geometry surrounding the probe contact.

FIG. 8 shows a high density integral test probe (12) with an additional sheet of polyimide (44) with enlarged holes (45) corresponding to the probe location placed on top of the first sheet of polyimide (40). The enlarged holes (45) in the second sheet of polyimide (44) acts as a cup to control and contain the creep of the solder balls at high temperatures.

Figure 9:
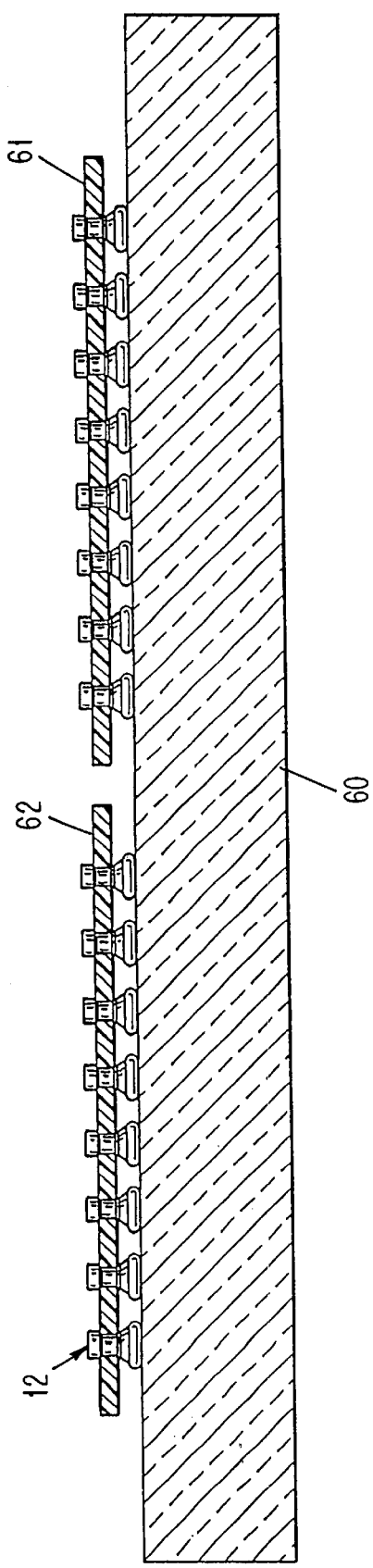
FIG. 9 shows an alternate embodiment of the high density integral rigid test probe with multiple probe arrays on a single substrate.

Multiple probe arrays can be fabricated on a single substrate (60) as shown in FIG. 9. Each array of probes is decoupled from the adjacent arrays by using separate polyimide sheets (61,62). Matched coefficients of thermal expansion for the polymer sheets (61,62) and the substrate (60) become increasingly more important for multiple arrays of probes on a large substrate. Each slight differences in the coefficient of thermal expansion can result in bowing of the substrate or excessive stresses in the substrate and polymer material over a large area substrate.

Figure 10:
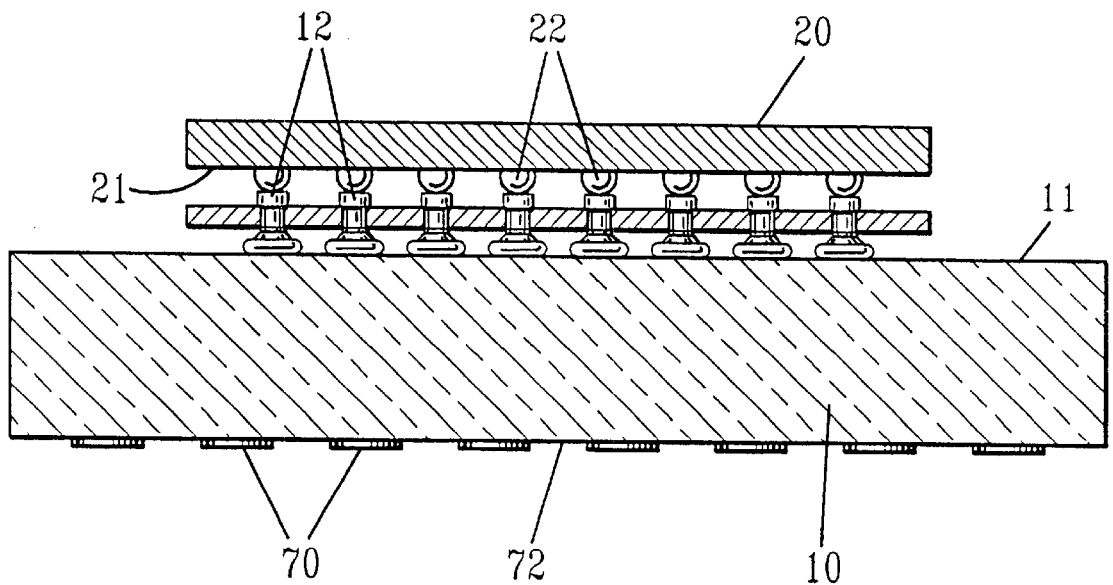
FIG. 10 shows the structure of FIG. 1 with contact locations on a second surface.

FIG. 10 shows the structure of FIG. 1 with second contact locations (70) on surface (72) of substrate 10. Contact locations (70) can be the same as contact locations (13).

Figure 11:
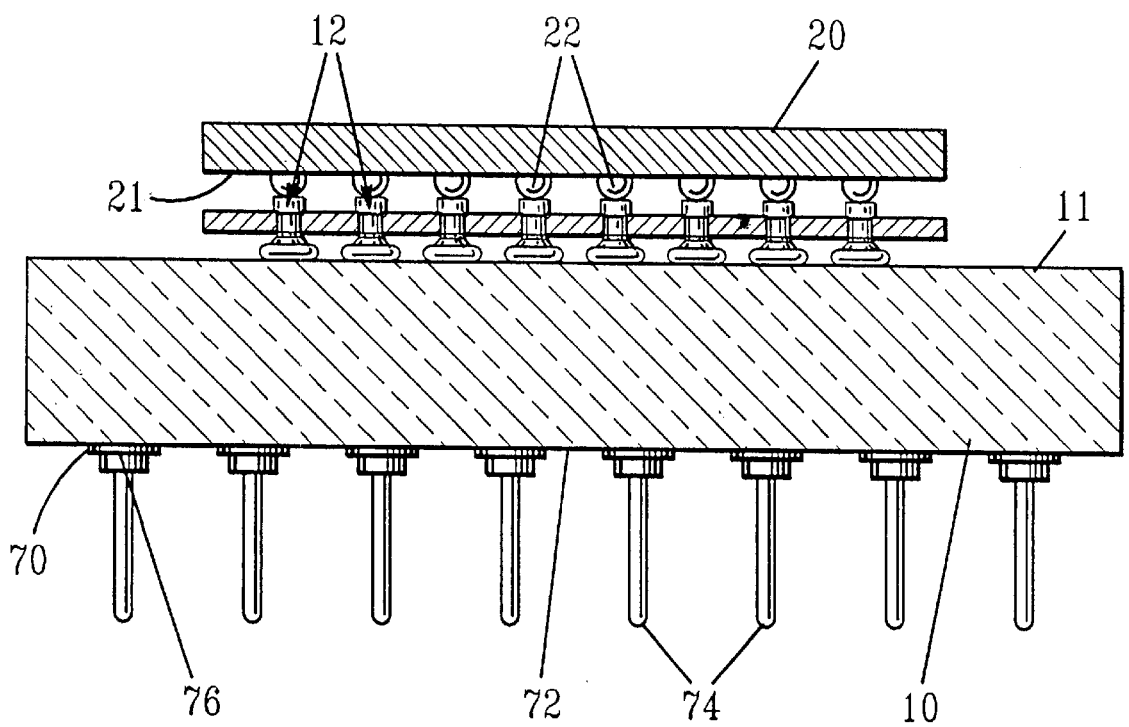
FIG. 11 shows the structure of FIG. 6 with conductive pins at the contact locations on the second surface.

FIG. 11 shows the structure of FIG. 6 with elongated conductors (74) such as pins fixed to the surface (76) of pad (70).

FIG. 12 shows substrate (10) disposed spaced apart from the IC device (20). Substrate (11) is held by arm (78) of fixture (80). The IC device (20) is disposed on support (82) which is disposed in contact with fixture (80) by base (84). Arm (78) is adapted for movement as indicated by arrow (86) towards base (84) so that probe tips (12) are brought into engagement with conductors (22). An example of an apparatus providing a means for moving substrate (10) into engagement with the IC device (20) can be found in U.S. Pat. No. 4,875,614.

While we have described out preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A method comprising the steps of:

providing a substrate having a surface;

bonding an elongated electrical conductor to said surface by forming a ball bond at said surface;

shearing said elongated conductor from said ball bond leaving an exposed end of said elongated conductor;

flattening said exposed end.

2. A method according to claim 1, further including the steps of:

providing a sheet of material having an opening therein;

disposing said sheet with respect to said surface so that said elongated conductor extends within said opening.

3. A method according to claim 2, further including disposing on said sheet a layer of material having an opening therein through which said elongated electrically conductive member is exposed.

4. A method according to claim 1, further including the step of moving said substrate towards a work piece so that said plurality of elongated electrical conductors are placed into electrical contact with a plurality of electrical conductors on a work piece.

5. A method according to claim 1 wherein said elongated electrical conductor is formed from a material selected from the group consisting of Cu, Au, Al, Pd and Pt, and their alloys.

6. A method according to claim 5 further including disposing said exposed end at least one coating selected from the group consisting of Pt, Ir, Rh, Ru, Pd, Cr, Ti, TiN, Zr, ZrN and Co.

7. A method according to claim 5 further including disposing on said exposed end a first coating selected from the group consisting of Cr, Ti, TiN, Ni, Zr, ZrN or Co and disposing a second coating over said first coating selected from the group consisting of Pt, Ir, Rh, Ru and Pd.

8. A method according to claim 1 further including disposing on said substrate a decoupling capacitor.

9. A method according to claim 1 wherein said elongated electrical conductors are ball bonded to electrical contact locations on said surface.

10. A method according to claim 1 wherein said substrate has another surface having a plurality of electrical contact locations thereon.

11. A method according to claim 10 wherein said contact locations on said another surface have elongated electrical conductor attached thereto.

12. A method according to claim 1 wherein said substrate has electrical conductor patterns therein.

* * * * *